United States Patent
Sawada et al.

(10) Patent No.: US 8,871,348 B2
(45) Date of Patent: Oct. 28, 2014

(54) GLASS SUBSTRATE WITH CONDUCTIVE FILM FOR SOLAR CELL

(75) Inventors: Masahiro Sawada, Shiga (JP); Tomohiro Nagakane, Shiga (JP)

(73) Assignee: Nippon Electric Glass Co. Ltd., Otsu-shi, Shiga (JP)

( * ) Notice: Subject to any disclaimer, the term of this patent is extended or adjusted under 35 U.S.C. 154(b) by 214 days.

(21) Appl. No.: 13/386,256

(22) PCT Filed: Jul. 22, 2010

(86) PCT No.: PCT/JP2010/062316
§ 371 (c)(1),
(2), (4) Date: Jan. 20, 2012

(87) PCT Pub. No.: WO2011/010685
PCT Pub. Date: Jan. 27, 2011

(65) Prior Publication Data
US 2012/0111406 A1  May 10, 2012

(30) Foreign Application Priority Data

Jul. 24, 2009 (JP) ................. 2009-173342
Jul. 12, 2010 (JP) ................. 2010-157886

(51) Int. Cl.
*C03C 17/245* (2006.01)
*H01L 31/0224* (2006.01)
*H01L 31/0392* (2006.01)
*C03C 23/00* (2006.01)
*H01L 31/18* (2006.01)

(52) U.S. Cl.
CPC ........ *H01L 31/0392* (2013.01); *C03C 2217/77* (2013.01); *C03C 17/2453* (2013.01); *C03C 2217/211* (2013.01); *C03C 17/2456* (2013.01); *C03C 23/007* (2013.01); *C03C 2217/241* (2013.01); *C03C 2218/152* (2013.01); *H01L 31/022475* (2013.01); *H01L 31/1884* (2013.01); *Y02E 10/542* (2013.01)
USPC ............ 428/426; 428/432; 428/141; 136/256

(58) Field of Classification Search
None
See application file for complete search history.

(56) References Cited

U.S. PATENT DOCUMENTS

| | | |
|---|---|---|
| 4,342,943 A | 8/1982 | Weaver |
| 4,640,900 A | 2/1987 | Kokubu et al. |

(Continued)

FOREIGN PATENT DOCUMENTS

| | | |
|---|---|---|
| EP | 1291329 A1 | 3/2003 |
| EP | 1919023 A1 | 5/2008 |

(Continued)

OTHER PUBLICATIONS

Machine Translation JP 2007-042366 Matsui et al. Feb. 15, 2007.*

(Continued)

*Primary Examiner* — David Sample
(74) *Attorney, Agent, or Firm* — Drinker Biddle & Reath LLP

(57) ABSTRACT

A glass substrate with a conductive film, which ensures that variation of power generation is less likely to occur when used in a thin solar cell, and is excellent in the sealability with a sealant, is provided.
A glass substrate with a conductive film for a solar cell which comprises a glass substrate having a thickness of 2 mm or less and a conductive film formed on the glass substrate, wherein the warp deformation amount W of the glass substrate represented by the following formula is 0.5 $\mu m/cm^2$ or less.

$W = D/L^2$ ($D$: the maximum warpage ($\mu m$) of the glass substrate, and $L$: the diagonal length (cm) of the glass substrate).

7 Claims, 2 Drawing Sheets

(56) References Cited

U.S. PATENT DOCUMENTS

| | | | |
|---|---|---|---|
| 4,741,849 A | 5/1988 | Naito et al. | |
| 4,927,721 A | 5/1990 | Gratzel et al. | |
| 5,009,922 A * | 4/1991 | Harano et al. | 427/571 |
| 5,076,876 A | 12/1991 | Dietz | |
| 5,084,365 A | 1/1992 | Gratzel et al. | |
| 5,252,521 A | 10/1993 | Roberts | |
| 5,733,828 A | 3/1998 | Usui et al. | |
| 5,753,571 A | 5/1998 | Donohue | |
| 6,103,648 A | 8/2000 | Yi | |
| 6,255,239 B1 | 7/2001 | Sakoske | |
| 6,849,797 B2 | 2/2005 | Koyanagi et al. | |
| 7,207,193 B2 * | 4/2007 | Xun et al. | 65/95 |
| 7,267,713 B2 | 9/2007 | Adachi | |
| 7,291,573 B2 | 11/2007 | Ide | |
| 7,736,546 B2 | 6/2010 | Prunchak | |
| 2003/0048580 A1 | 3/2003 | Hasegawa et al. | |
| 2005/0104032 A1 | 5/2005 | Cho et al. | |
| 2005/0120748 A1 | 6/2005 | Xun et al. | |
| 2005/0181927 A1 | 8/2005 | Hasegawa et al. | |
| 2005/0242725 A1 | 11/2005 | Hasegawa et al. | |
| 2006/0003883 A1 | 1/2006 | Yoshida et al. | |
| 2006/0063009 A1 | 3/2006 | Naitou et al. | |
| 2006/0105898 A1 | 5/2006 | Ide | |
| 2006/0172876 A1 | 8/2006 | Emlemdi | |
| 2006/0231803 A1 | 10/2006 | Wang et al. | |
| 2006/0289055 A1 | 12/2006 | Sridharan et al. | |
| 2007/0006917 A1 | 1/2007 | Gonda et al. | |
| 2007/0163645 A1 | 7/2007 | Gonda et al. | |
| 2007/0249483 A1 | 10/2007 | Ritter et al. | |
| 2007/0267215 A1 | 11/2007 | Dernovsek et al. | |
| 2007/0286973 A1 | 12/2007 | Sawai et al. | |
| 2008/0096752 A1 | 4/2008 | Nagaoka | |
| 2008/0096753 A1 | 4/2008 | Yamamoto | |
| 2008/0318061 A1 | 12/2008 | Inaba et al. | |
| 2009/0064717 A1 | 3/2009 | Son et al. | |
| 2009/0136766 A1 | 5/2009 | Son et al. | |
| 2012/0111406 A1 | 5/2012 | Sawada et al. | |
| 2012/0325311 A1 | 12/2012 | Yamada et al. | |

FOREIGN PATENT DOCUMENTS

| | | |
|---|---|---|
| JP | 1220380 A | 9/1989 |
| JP | 9278483 A | 10/1997 |
| JP | 2691263 B2 | 12/1997 |
| JP | 11135819 | 5/1999 |
| JP | 2001093591 A | 4/2001 |
| JP | 2002075472 A | 3/2002 |
| JP | 2002241143 A | 8/2002 |
| JP | 2002-260448 | 9/2002 |
| JP | 2003095697 A | 4/2003 |
| JP | 2003142170 A | 5/2003 |
| JP | 2003217688 A | 7/2003 |
| JP | 2004292247 A | 10/2004 |
| JP | 2005213103 A | 8/2005 |
| JP | 2005213132 A | 8/2005 |
| JP | 2006169047 A | 6/2006 |
| JP | 2006342044 A | 12/2006 |
| JP | 2007031258 A | 2/2007 |
| JP | 2007042366 A | 2/2007 |
| JP | 2007246355 A | 9/2007 |
| JP | 2007311242 A | 11/2007 |
| JP | 2007320822 A | 12/2007 |
| JP | 2008-282863 | 11/2008 |
| JP | 2008282863 A | 11/2008 |
| JP | 2009-037861 | 2/2009 |
| JP | 2009037861 A | 2/2009 |
| JP | 2009067672 A | 4/2009 |
| JP | 2009126782 A | 6/2009 |
| WO | WO 0128949 A1 * | 4/2001 |
| WO | WO-2005000755 A1 | 1/2005 |
| WO | WO-2005073142 A1 | 8/2005 |
| WO | WO-2007075190 A1 | 7/2007 |
| WO | WO-2009128451 A1 | 10/2009 |
| WO | WO-2009128527 A1 | 10/2009 |

OTHER PUBLICATIONS

Toumei Douden-Maku no Gijutsu, Technology of Transparent Conductive Film, $2^{nd}$ revised edition, May 20, 2008, pp. 153-165, Ohmsha, Ltd. [in Japanese language].

International Search Report dated Aug. 24, 2010 for International Application No. PCT/JP2010/062316 filed Jul. 22, 2010.

International Search Report/Written Opinion dated Aug. 24, 2010 for International Application No. PCT/JP2010/062316 filed Jul. 22, 2010. [in Japanese Language].

Toumei Douden-Masku no Gijutsu, Technology of Transparent Conductive Film, 2nd revised edition, May 20, 2008, pp. 153-165, Ohmsha, Ltd. [in Japanese language].

Office Action mailed Jan. 2, 2013, in U.S. Appl. No. 13/604,926, filed Sep. 6, 2012.

Office Action mailed Mar. 6, 2012, in U.S. Appl. No. 12/457,174, filed Jun. 3, 2009.

Office Action mailed Sep. 14, 2011, in U.S. Appl. No. 12/457,174, filed Jun. 3, 2009.

Office Action mailed Apr. 27, 2011, in U.S. Appl. No. 12/981,808, filed Dec. 30, 2010.

Notification for Reasons for Refusal issued Apr. 15, 2013, in JP 2008-240955.

Notification for Reasons for Refusal issued Apr. 10, 2013, in JP 2008-240955, with English-language translation.

Notification of Reasons for Refusal dated May 28, 2013, issued in Japanse Patent Application No. 2008-258761, with English-language translation.

Notificiation of the Second Office Action issued Jul. 18, 2013, in Chinese Patent Application No. 200980122754.1.

Chinese Office Action issued Nov. 1, 2013, in Chinese Application No. 200980122754.1.

* cited by examiner

US 8,871,348 B2

GLASS SUBSTRATE WITH CONDUCTIVE FILM FOR SOLAR CELL

TECHNICAL FIELD

The present invention relates to a glass substrate with a conductive film for a solar cell. More specifically, the present invention relates to a glass substrate with a conductive film suitable as an electrode substrate used for a solar cell.

BACKGROUND ART

In recent years, demands for a solar cell such as a monocrystalline silicon solar cell, a polycrystalline silicon solar cell and an amorphous silicon solar cell are more and more increasing. These solar cells are utilized mainly for home electrical power generation, commercial electrical power generation and the like. As other solar cells, a CIS solar cell, a CdTe solar cell, a dye-sensitized solar cell, an organic thin film solar cell and the like have been developed, and these are also being put into practical use.

In a solar cell, a glass substrate with a conductive film is used as the electrode substrate. Here, a soda lime glass is generally used as the glass substrate, because of its advantage in view of production cost and versatility. Also, as the conductive film, a transparent conductive film such as fluorine-doped tin oxide (FTO) and tin-doped indium oxide (ITO) is used. Above all, FTO is chemically and thermally stable, though inferior to ITO in the resistivity, and is expected to produce an effect of, for example, confining light by the uneven profile of the film surface or enhancing the electrical conductivity by the increase in the surface area, and therefore, FTO is widely used as an electrode substrate for a dye-sensitized solar cell or amorphous silicon solar cell (see, for example, Patent Document 1 and Non-Patent Document 1).

In general, for the production of an FTO film, a thermal chemical vapor deposition (thermal CVD) method is used in view of good film formability and low cost. Specifically, the film is formed by causing a mixed gas of compounds containing tin and fluorine to undertake a thermal decomposition reaction on a glass substrate heated at about 400° C. or more. In this connection, the thermal CVD method includes an on-line CVD method of forming a film in a sheet glass production line by utilizing the heat thereof, and an off-line CVD method of cutting once-cooled glass into a predetermined dimension and re-heating it to form a film.

Meanwhile, with recent popularization of mobile electronic appliances, a solar cell is also coming into use as a power source thereof, in addition to the conventional battery. In use for a mobile electronic device, a solar cell is required to be more reduced in the thickness and weight than the conventional solar cell installed outdoors and used for home or commercial power generation. In particular, a dye-sensitized solar cell exhibits high energy conversion efficiency for indoor light compared with a crystalline silicon solar cell, and the demand for this solar cell is increasing.

A dye-sensitized solar cell consists of, for example, a glass substrate with a conductive film, a porous oxide semiconductor electrode composed of a porous oxide semiconductor layer (mainly titanium oxide layer) formed on the glass substrate with a conductive film, a dye such as Ru dye adsorbed to the porous oxide semiconductor electrode, an iodine electrolytic solution containing iodine, and a counter electrode substrate having formed thereon a catalyst film and a conductive film. Here, in order to prevent leakage of the iodine electrolytic solution filled between the glass substrate with a conductive film and the counter electrode substrate, the outer peripheral edges of the glass substrate with a conductive film and the counter electrode substrate are sealed with a sealant such as resin and low melting-point glass, e.g., lead glass, bismuth borate glass.

RELATED ART DOCUMENTS

Patent Document

Patent Document 1: JP-A-2002-260448

Non-Patent Document

Non-Patent Document 1: *Toumei Douden-Maku no Gijutsu* (Technology of Transparent Conductive Film), (2nd revised edition), Ohmsha, Ltd., pp. 153-165

SUMMARY OF THE INVENTION

Problems that the Invention is to Solve

When reduction in the thickness of a solar cell is tried by reducing the thickness of a glass substrate with a conductive film, unlike in the conventional unthinned solar cell, variation of power generation is liable to occur and a uniform power generation state can be hardly obtained on a solar cell panel. Also, the conventional glass substrate with a conductive film is poor in the sealability with a sealant and has a problem that a trouble such as leakage of an iodine electrolytic solution is readily generated, for example, in a dye-sensitized solar cell.

Accordingly, an object of the present invention is to provide a glass substrate with a conductive film, which ensures that variation of power generation is less likely to occur when used in a thin solar cell, and is excellent in the sealability with a sealant.

Means for Solving the Problems

As a result of intensive studies, the present inventors have found out that warp deformation of the glass substrate with a conductive film is a cause of the power generation variation occurring when the solar cell is thinned. It has been found that the problem above can be overcome by limiting the warp deformation of the glass substrate with a conductive film to a certain range. The present invention has been proposed based on the findings.

That is, the present invention relates to a glass substrate with a conductive film for a solar cell which comprises a glass substrate having a thickness of 2 mm or less and a conductive film formed on the glass substrate, wherein the warp deformation amount W of the glass substrate represented by the following formula is 0.5 $\mu m/cm^2$ or less.

$W=D/L^2$ ($D$: the maximum warpage ($\mu$m) of the glass substrate, and $L$: the diagonal length (cm) of the glass substrate)

The warp deformation amount W as used in the present invention indicates a value obtained by placing a glass substrate with a conductive film on a plate with the conductive film surface up and dividing the difference between the maximum value and the minimum value of height based on the plate surface (maximum warpage of the glass substrate) by the square of the diagonal length of the glass substrate. The warpage of the glass substrate can be measured, for example, by a straightness measuring device capable of measuring the height or a warpage measuring device utilizing a laser.

When a conductive film is formed on a glass substrate, distortion is generated inside the glass substrate due to a difference in the thermal expansion coefficient between the glass substrate and the conductive film, and warp deformation is readily caused. The glass substrate with a conductive film having a large thickness, which has been conventionally used for a solar cell, is relatively free of the problem of warp deformation because the mechanical strength is large, but when the thickness of the glass substrate with a conductive film is small, particularly, when the thickness is 2 mm or less, warp deformation becomes large. The large warp deformation causes a problem in the process such as film formation, printing, sealing and assembly during the cell production of a solar cell.

For example, a dye-sensitized solar cell generally has a structure in which two glass substrates with a conductive film are laminated together in a state of keeping a constant cell gap therebetween, but when large warp deformation is generated in the substrates, the lamination becomes difficult and a constant cell gap is not ensured, as a result, variation of power generation occurs on the solar cell panel.

Furthermore, in the process of manufacturing a dye-sensitized solar cell, a titanium oxide paste working out to the power generation layer is coated on the glass substrate with a conductive film by using a screen printing method, but when large warp deformation is generated in the glass substrate with a conductive film, coating unevenness is readily caused. The coating unevenness of the titanium oxide paste also gives rise to the variation of power generation.

In addition, a sealant such as resin and low melting-point glass is coated on the glass substrate with a conductive film by using a screen printing method. Therefore, when large warpage is generated in the glass substrate with a conductive film, coating unevenness is caused, and poor sealing results. For example, in a dye-sensitized solar cell, a trouble such as leakage of an iodine electrolytic solution is liable to occur.

In the glass substrate with a conductive film for a solar cell of the present invention, the warp deformation amount W of the glass substrate is specified to the range above, whereby the above-described problems can be solved and not only the variation of power generation on the solar cell panel can be minimized, uniform power generation is realized, but also a glass substrate with a conductive film allowing for excellent sealing with a sealant can be provided.

Secondly, in the glass substrate with a conductive film for a solar cell of the present invention, the conductive film is preferably a conductive film of fluorine-doped tin oxide.

As described above, a conductive film composed of fluorine-doped tin oxide (FTO film) is chemically and thermally stable and is expected to produce an effect of, for example, confining light by the uneven profile of the film surface or enhancing the electrical conductivity by the increase in the surface area, and therefore, it is suitable as an electrode substrate particularly for a dye-sensitized solar cell or an amorphous silicon solar cell.

Thirdly, in the glass substrate with a conductive film for a solar cell of the present invention, the thermal expansion coefficient of the glass substrate is preferably from 60 to $85 \times 10^{-7}/°C$.

By limiting the thermal expansion coefficient of the glass substrate to the range above, it becomes easy to match the thermal expansion coefficient to other members such as titanium oxide, current collector and low melting-point glass for sealing. As a result, the problem of stripping or cracking caused due to mismatch in the thermal expansion coefficient is hardly brought about. Also, the film stress produced between the conductive film and the glass substrate can be reduced, and the warp deformation of the glass substrate can be suppressed.

The thermal expansion coefficient of the glass substrate as used in the present invention indicates the thermal expansion coefficient in the range of 30 to 380° C. as measured in accordance with JIS R3103.

Fourthly, in the glass substrate with a conductive film for a solar cell of the present invention, the warp deformation amount W of the glass substrate after a heat treatment at 500° C. for 30 minutes is preferably 0.5 $\mu m/cm^2$ or less.

In some cases, the glass substrate with a conductive film is subjected to a heat treatment in the process of manufacturing a solar cell. For example, in the process of manufacturing a dye-sensitized solar cell, firing of a titanium oxide paste or the like is performed. The warp deformation of the glass substrate with a conductive film after the heat treatment tends to be more prominent than that before the heat treatment. According to the present invention, even after the heat treatment at 500° C. for 30 minutes, the warp deformation amount W of the glass substrate satisfies the range above and therefore, uniformity of power generation on the solar cell panel and the sealability with a sealant are very excellent.

Fifthly, the glass substrate with a conductive film for a solar cell of the present invention is characterized in that the warp deformation amount W of the glass substrate after a heat treatment at 550° C. for 30 minutes is 0.5 $\mu m/cm^2$ or less.

Sixthly, in the glass substrate with a conductive film for a solar cell of the present invention, the strain point of the glass substrate is preferably 525° C. or more.

The strain point of the glass substrate is specified to the range above, whereby even when a stress is generated inside the glass substrate, warp deformation caused due to structural relaxation during a heat treatment can be suppressed.

The strain point of the glass substrate as used in the present invention indicates the value as measured in accordance with JIS R3103.

Seventhly, in the glass substrate with a conductive film for a solar cell of the present invention, the solar cell is preferably a dye-sensitized solar cell.

MODE FOR CARRYING OUT THE INVENTION

In the present invention, the warp deformation amount W of the glass substrate is 0.5 $\mu m/cm^2$ or less, preferably 0.4 $\mu m/cm^2$ or less, more preferably 0.3 $\mu m/cm^2$ or less. If the warp deformation amount W of the glass substrate exceeds 0.5 $\mu m/cm^2$, the cell gap can be hardly kept constant when two glass substrates with a conductive film are disposed to face each other and laminated together, or coating unevenness of a titanium oxide paste is readily caused, giving rise to variation of power generation. Furthermore, coating unevenness of a sealant such as resin and low melting-point glass that is similarly coated on the glass substrate may be also readily caused, leading to a sealing defect.

Incidentally, at the manufacture of, for example, a dye-sensitized solar cell, lamination together of two glass substrates with a conductive film is performed after the firing step of a titanium oxide paste layer. Accordingly, the warp deformation amount W of the glass substrate with a conductive film of the present invention after the firing step preferably satisfies the range above. Specifically, in the glass substrate with a conductive film of the present invention, the warp deformation amount W of the glass substrate after heating at 500° C. for 30 minutes is 0.5 μm/cm² or less, preferably 0.4 μm/cm² or less, more preferably 0.3 μm/cm² or less.

The mechanism of warp deformation of the glass substrate with a conductive film is described below.

The warp deformation of the glass substrate with a conductive film is related to (a) the effect of a film stress due to a difference in the thermal expansion between the conductive film and the glass substrate during film formation, (b) the effect of a residual stress produced in the glass substrate after gradual cooling, and (c) the effect of structural relaxation generated when the glass substrate is heat-treated at the manufacture of a solar cell.

(a) Effect of Film Stress

In general, the film stress when a conductive film is formed on a glass substrate is represented by the following formula (1).

$$\sigma = E \times (\alpha_s - \alpha_f) \times (T_d - T_r) \quad (1)$$

σ: the film stress, E: the Young's modulus of the conductive film,
$\alpha_s$: the thermal expansion coefficient of the glass substrate,
$\alpha_f$: the thermal expansion coefficient of the conductive film,
$T_d$: the film formation temperature, $T_r$: room temperature.

Figure 1:
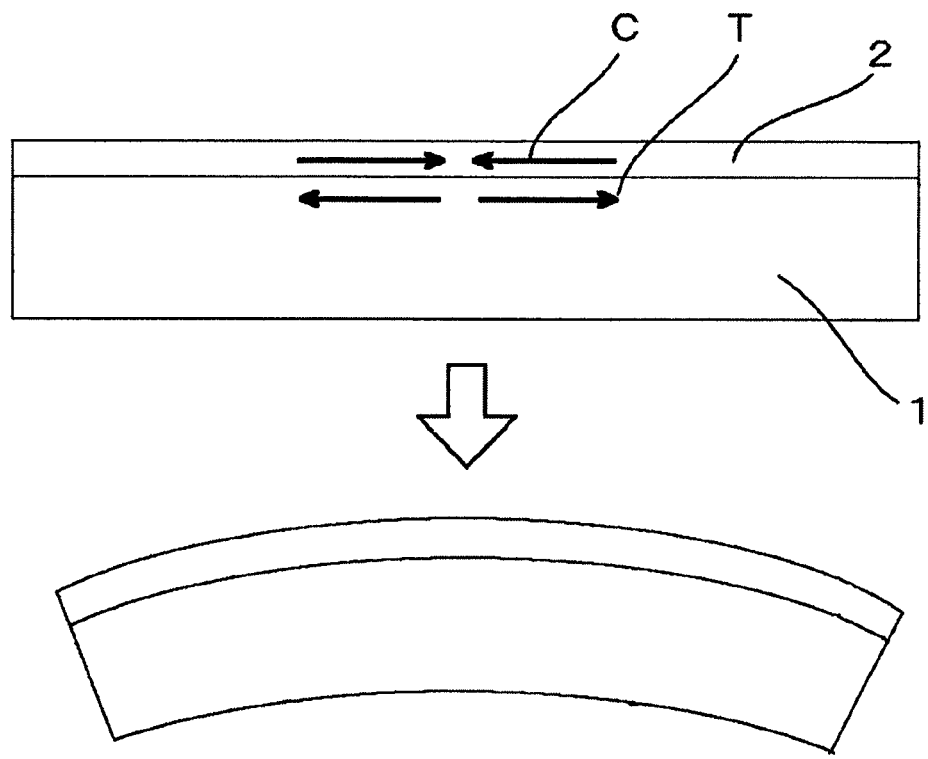
FIG. 1 A schematic view for explaining the mechanism of warp deformation occurring in the glass substrate with a conductive film by the effect of a film stress.

Here, each of the Young's modulus and the thermal expansion coefficient of the conductive film takes a value inherent in the conductive film formed, and this reveals that the film stress is dependent on the thermal expansion coefficient of the substrate and the film formation temperature. For example, the thermal expansion coefficient of FTO film is known to be 35×10⁻⁷/° C. (Solar Energy Materials and Cells, 49 (1997) 107-112)). On the other hand, the glass substrate used for a dye-sensitized solar cell is generally a glass substrate having a thermal expansion coefficient of 60 to 85×10⁻⁷/° C., and the glass substrate is larger in the thermal expansion coefficient than the FTO film. Accordingly, at the interface between the FTO film and the glass substrate, a compressive stress is produced on the FTO film side, and a tensile stress is produced on the glass substrate side, as a result, the glass substrate is convexly warp-deformed with the FTO film up (see, FIG. 1). Incidentally, when the thickness of the glass substrate is sufficiently large, the elasticity of the substrate surpasses the film stress and therefore, warp deformation is not caused.

(b) Effect of Residual Stress Produced in Glass Substrate after Gradual Cooling

In the production process of a sheet glass, a molten glass is formed into a sheet by a float method or the like and then gradually cooled in a gradual cooling furnace. Usually, the cooling rate in the surface part of the glass substrate is high, and the cooling rate in the central part is low. Due to this difference in the cooling rate, even after gradual cooling, a residual stress tends to be slightly generated. At this time, a compressive stress works in the surface part of the glass substrate, and a tensile stress works in the central part. As the thickness of the glass is larger or the cooling rate is higher, these stresses increase. This is because a temperature distribution is liable to be produced in the thickness direction of the glass substrate.

Also, in the film formation step, according to an on-line CVD method, a film is formed at a temperature not less than the strain point of the glass substrate, and according to an off-line CVD method, a film is formed in a state of the glass substrate being heated to a temperature near the strain point. Therefore, if gradual cooling after film formation is not sufficiently performed, as described above, a residual stress is generated due to a difference in the cooling rate between the surface part and the central part of the glass substrate.

Figure 2:
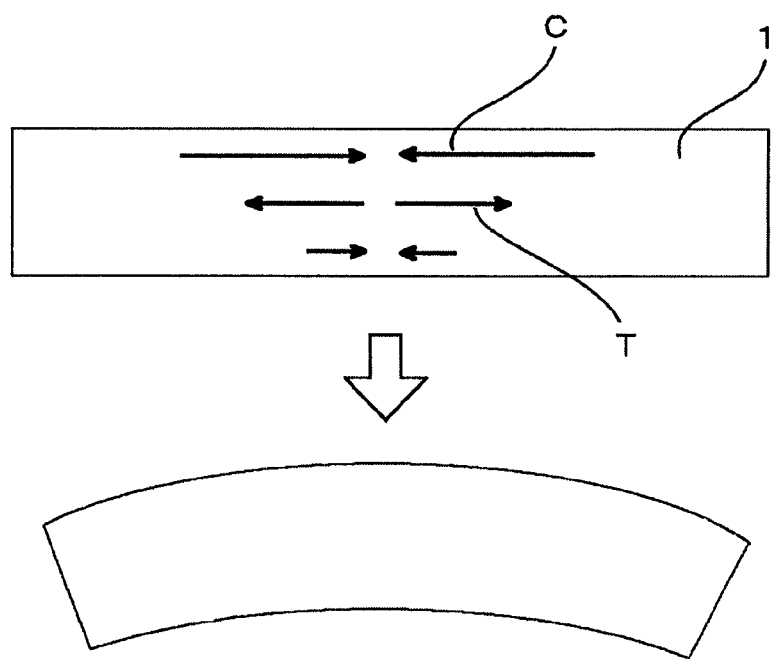
FIG. 2 A schematic view for explaining the mechanism of warp deformation occurring in the glass substrate by the effect of a residual stress produced after gradual cooling.

In this way, the process for producing a glass substrate or the process for forming a conductive film includes a cooling step from a heated state. If the stress balance is lost, for example, as in the case where the cooling rate differs between the front and the back of glass, this may promote warp deformation (see, FIG. 2).

Also, if the glass surface on the side opposite the conductive film is ground so as to reduce the thickness of glass in the state of a residual stress being present in the glass substrate, the compressive stress generating part in the glass surface on the side opposite the conductive film is removed and therefore, an imbalance is produced in the residual stress distribution in the thickness direction of the glass substrate to allow for generation of large warp deformation. For this reason, the amount of the glass substrate ground after forming the conductive film thereon is ½ or less, preferably ¼ or less, of the thickness before grinding, and it is more preferred not to perform the grinding.

Figure 3:
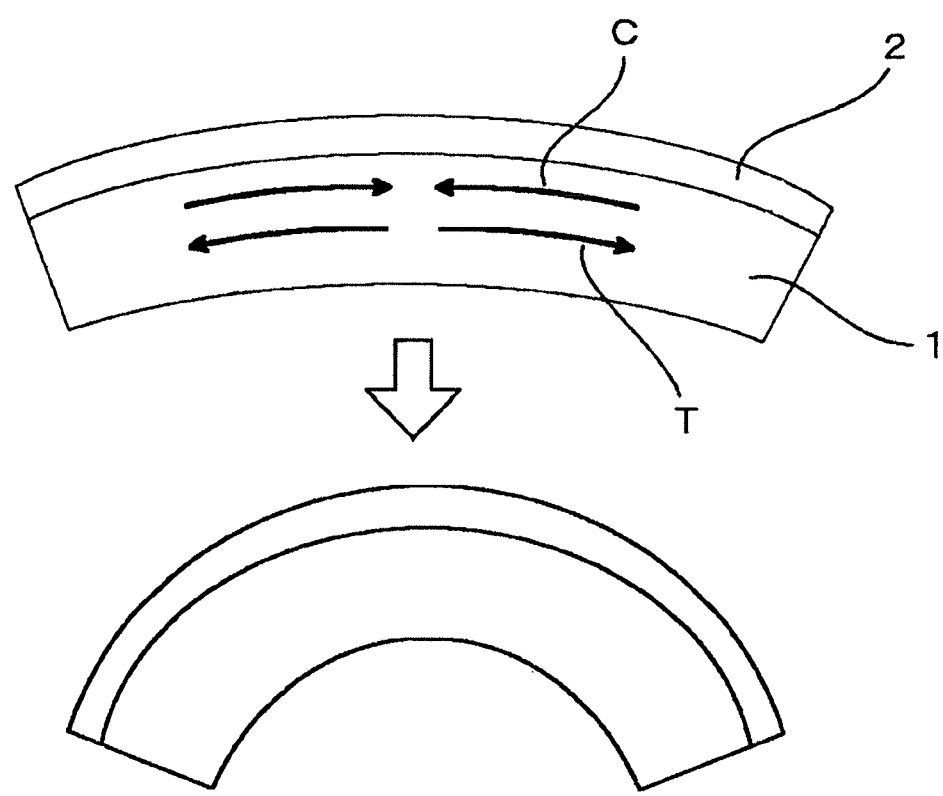
FIG. 3 A schematic view for explaining the mechanism of warp deformation occurring in the glass substrate with a conductive film due to structural relaxation generated when heat-treated.

(c) Effect of Structural Relaxation Generated when Glass Substrate is Heat-Treated As described above, a residual stress ascribable to a film stress is usually present in the glass substrate after formation of the conductive film. When the glass substrate with a conductive film in which a residual stress is present is subjected to a heat treatment in the manufacturing process of a solar cell, structural relaxation of glass occurs and a change is produced in the residual stress. In this case, at the interface of the glass substrate with the conductive film, a tensile stress is produced by the above-described film stress and therefore, shrinkage due to structural relaxation hardly occurs. On the other hand, on the surface opposite the conductive film, shrinkage due to structural relaxation is liable to proceed because of almost no effect of the film stress. Accordingly, a compressive stress is generated on the conductive film side of the glass substrate, and a tensile stress is generated on the opposite side, as a result, particularly in the case where the conductive film is FTO film, warp deformation is readily promoted (see, FIG. 3).

Incidentally, as the viscosity of the glass is lower, the structural relaxation by a heat treatment is more liable to occur. Here, the viscosity of glass is dependent on the stain point and as the strain point is larger, the viscosity is higher, and structural relaxation and in turn, warp deformation are less liable to occur. From such a viewpoint, the strain point of the glass substrate is preferably 525° C. or more, more preferably 550° C. or more.

In the present invention, the thickness of the glass substrate is preferably 2 mm or less, 1.8 mm or less, 1.5 mm or less, or particularly 1.2 mm or less. If the thickness of the glass substrate exceeds 2 mm, it is difficult to achieve reduction in the thickness and weight of the solar cell. On the other hand, if the thickness of the glass substrate is too small, the strength is reduced and breakage readily occurs, though the flexibility may be excellent. Accordingly, the lower limit of the thickness of the glass substrate is preferably 0.05 mm or more, 0.1 mm or more, or particularly 0.2 mm or more.

Examples of the conductive film include a fluorine-doped tin oxide (FTO), an antimony-doped tin oxide (ATO), and a tin-doped indium oxide (ITO).

The thickness of the conductive film is preferably adjusted in the range of 0.4 to 1.5 μm. If the thickness of the conductive film is less than 0.4 μm, sufficient electrical conductivity can be hardly obtained. On the other hand, if the thickness of the conductive film exceeds 1.5 μm, a large film stress tends to be produced to increase the warp deformation. Also, the transmittance for the sunlight spectrum and in turn, the power generation efficiency of the solar cell are liable to be reduced.

The resistance value of the conductive film is preferably 25 Ω/sq. or less, more preferably 15 Ω/sq. or less. If the resistance value exceeds 25 Ω/sq., the electrical conductivity of the film tends to be reduced to suffer from poor performance as a solar cell.

The average surface roughness (Ra) of the conductive film is preferably 20 nm or more, more preferably 30 nm or more. By setting the average surface roughness of the film to the range above, the effect of confining light is brought out and at the same time, the surface area of the film is increased, so that the electrical conductivity can be enhanced.

As for the raw material of the FTO film formed by a film formation method such as thermal CVD method, $SnCl_4$, $C_4H_9SnCl_3$, $(CH_3)_2SnCl_2$ and the like can be used as the tin source, and HF, $CF_3COOH$, $CHF_2$, $CCl_2F_2$ and the like can be used as the fluorine source.

In the present invention, the film formation temperature of the conductive film is preferably from 400 to 650° C., from 400 to 600° C., or particularly from 420 to 570° C. If the film formation temperature is less than 400° C., the film formation rate is too slow and the productivity is extremely low, which is not practical. If the film formation temperature exceeds 650° C., the film stress becomes excessively large due to the above formula (1) and particularly when the glass substrate becomes as thin as 2 mm or less, warp deformation is liable to occur.

Incidentally, in the case where the glass substrate is composed of glass containing an alkali metal oxide, an undercoat layer such as $SiO_2$ may be provided between the conductive film and the glass substrate. By providing such an undercoat layer, the FTO film can be prevented from reduction in the electrical conductivity due to an alkali ion eluted from the glass.

In the present invention, the thermal expansion coefficient of the glass substrate is preferably from 60 to $85 \times 10^{-7}$/° C., from 70 to $85 \times 10^{-7}$/° C., or particularly from 75 to $85 \times 10^{-7}$/° C. If the thermal expansion coefficient of the glass substrate is less than $60 \times 10^{-7}$/° C., due to mismatch in the thermal expansion coefficient to other members such as titanium oxide, current collector and low melting-point glass for sealing, stripping or cracking of such a member is readily caused. On the other hand, if the thermal expansion coefficient of the glass substrate exceeds $85 \times 10^{-7}$/° C., the film stress becomes excessively large due to the above formula (1) and particularly when the glass substrate is as thin as 2 mm or less, warp deformation is liable to occur.

Incidentally, when the glass substrate with a conductive film of the present invention is applied to a dye-sensitized solar cell, heat treatment steps all at around 500 to 550° C., such as firing step of a titanium oxide paste or a current collector and sealing step with a low melting-point glass for sealing, are present in the manufacturing process of the dye-sensitized solar cell. For example, firing of a titanium oxide paste is provided for the purpose of enhancing the electron conductivity and is performed at 480 to 580° C. at which titanium oxide particles are fused to each other. If the firing temperature is less than 480° C., fusion (necking) of titanium oxide particles to each other is likely to be insufficient. When the firing temperature becomes high, the fusion area of titanium oxide particles to each other is increased and therefore, the electrical conduction path becomes large, but if the firing temperature exceeds 580° C., fusion of titanium oxide particles excessively proceeds and this tends to cause decrease in the specific surface area of the titanium oxide particle or transition of the titanium oxide particle from anatase to rutile, as a result, the energy conversion efficiency is liable to be reduced.

EXAMPLES

The present invention is described below based on Examples, but the present invention is not limited to these Examples.

Examples 1 to 5

An FTO film was formed by the thermal CVD method on a glass substrate (250×250 mm) having the characteristics and thickness shown in Table 1. Specifically, $(CH_3)_2SnCl_2$ and $CF_3COOH$ were used as raw materials, and these were once gasified and then blown onto a glass substrate heated to the film formation temperature shown in Table 1, whereby film formation was performed to obtain a glass substrate with a conductive film. The film formation time was adjusted in the range of 2 to 5 minutes so that the FTO film could have a thickness of about 1 μm. After the film formation, the glass substrate was gradually cooled at 20° C./min.

The resulting glass substrate with a conductive film was cut into 150×200 mm, and the warp deformation amount was measured. As for Example 2, the surface, which is opposite the side where the conductive film was formed, was ground to a predetermined thickness and then, the warp deformation amount was measured.

The warp deformation amount was calculated by placing the glass substrate with a conductive film after gradual cooling on a plate, measuring the maximum warp deformation amount by a straightness measuring device (manufactured by Fujita Seisakusho K.K.), and dividing the maximum warp deformation amount by the square of the diagonal length of the glass substrate.

Next, the glass substrate with a conductive film was heat-treated at 500° C. for 30 minutes and after gradual cooling, the warp deformation amount was measured. At this time, the profile of the heat treatment was set to a temperature rise at 10° C./min and a temperature drop at 2° C./min. As for Example 5, a glass substrate subjected to a heat treatment at 550° C. for 30 minutes was also measured.

Furthermore, the glass substrate with the FTO film was cut into 150×200 mm, and a titanium oxide paste (Ti-Nanoxide D/SP, produced by SOLARONIX) was screen-printed thereon to a width of 5 mm and a length of 180 mm by using a 200-mesh screen. The titanium oxide layer after screen printing was confirmed with an eye and rated "A" when the layer was uniformly printed over the entire surface of the glass substrate, and rated "B" when an unprinted portion or apparent coating unevenness was observed. The results are shown in Table 1.

Subsequently, the sealability was evaluated as follows.

The glass substrate with the FTO film was bisected and cut into a size of 75×100 mm, and a UV-curable resin was coated on the FTO film surface in the outer edge of one glass substrate by using a dispenser. At this time, the discharge amount of the UV curable resin was adjusted to give a line width of 5 mm and a thickness of about 100 μm after sealing. Thereafter, this UV curable resin-coated substrate and another substrate were opposed so that the FTO film surfaces could face each other, and both glass substrates were bonded by the irradiation of UV light. The bonded portion was observed with an eye and rated as "A" when an unbonded portion was not observed and the sealed state was good, and rated "B" when a sealing failure was produced, for example, an unbonded portion was observed.

Comparative Example

With respect to a commercially available glass substrate with a FTO film of 150×200×4 mm (produced by Nippon Sheet Glass Co., Ltd.), the glass surface opposite the side where the FTO film was formed, was ground to a thickness of 1.1 mm. The glass substrate with the FTO film after grinding was measured for the warp deformation amount.

Subsequently, the glass substrate with the FTO film after grinding was heat-treated at 500° C. for 30 minutes and after gradual cooling, the warp deformation amount was measured. At this time, the heat treatment profile was set to a temperature rise at 10° C./min and a temperature drop at 2° C./min. A glass substrate subjected to a heat treatment at 550° C. for 30 minutes was also measured in the same manner.

A titanium oxide paste was screen-printed on the glass substrate with the FTO film by the same method as in Examples, and the printability was confirmed. The sealability was also evaluated in the same manner. The results are shown in Table 1.

TABLE 1

|  |  | Example | | | | | Comparative |
| --- | --- | --- | --- | --- | --- | --- | --- |
|  |  | 1 | 2 | 3 | 4 | 5 | Example |
| Thickness of glass (mm) | At film formation | 1.8 | 1.8 | 1.1 | 1.1 | 1.1 | 4 |
|  | After grinding | — | 1.1 | — | — | — | 1.1 |
| Thermal expansion coefficient (×10$^{-7}$/° C.) |  | 83 | 83 | 83 | 83 | 83 | 86 |
| Strain point (° C.) |  | 580 | 580 | 580 | 580 | 580 | 510 |
| Film formation temperature (° C.) |  | 450 | 450 | 450 | 520 | 540 | 650 |
| Warp deformation amount (μm/cm$^2$) | Before heat treatment | 0.1 | 0.2 | 0.1 | 0.2 | 0.2 | 0.6 |
|  | After heat treatment (500° C.) | 0.1 | 0.2 | 0.2 | 0.3 | 0.2 | 1.0 |
|  | After heat treatment (550° C.) | — | — | — | — | 0.3 | 3.2 |
| Printability |  | A | A | A | A | A | B |
| Sealability |  | A | A | A | A | A | B |

As apparent from Table 1, in Examples 1 to 5, the warp deformation amount of the glass substrate with the FTO film was small and both the printability and the sealability of the titanium oxide paste were good. On the other hand, in Comparative Example, the thermal expansion coefficient of the glass substrate was large and the strain point of glass was low, as a result, the warp deformation amount was large, that is, the warp deformation amount before heating was 0.6 μm/cm$^2$, the warp deformation amount after heating at 500° C. was 1.0 μm/cm$^2$, and the warp deformation amount after heating at 550° C. was 3.2 μm/cm$^2$. Therefore, coating unevenness or partial non-printing of the titanium oxide paste was observed and the printability was poor. The sealability was also poor.

While the present invention has been described in detail and with reference to specific embodiments thereof, it will be apparent to one skilled in the art that various changes and modifications can be made therein without departing from the spirit and scope of the present invention.

This application is based on Japanese Patent Application (Patent Application No. 2009-173342) filed on Jul. 24, 2009 and Japanese Patent Application (Patent Application No. 2010-157886) filed on Jul. 12, 2010, the contents of which are incorporated herein by way of reference.

DESCRIPTION OF REFERENCE NUMERALS AND SIGNS

1 Glass substrate
2 Conductive film
C Compressive stress
T Tensile stress

The invention claimed is:

1. A glass substrate with a conductive film for a solar cell which comprises:
   a glass substrate having a thickness of 2 mm or less; and
   a conductive film formed on the glass substrate having a surface roughness greater than 20 nm,
   wherein the thin film is generated at a film formation temperature in the range of 420°-650° C., and
   wherein the warp deformation amount W of the glass substrate with the conductive film represented by the following formula is 0.5 μm/cm$^2$ or less $W=D/L^2$ ($D$: the maximum warpage (μm) of the glass substrate, and $L$: the diagonal length (cm) of the glass substrate).

2. The glass substrate with a conductive film for a solar cell as described in claim 1, wherein the conductive film is a conductive film of fluorine-doped tin oxide.

3. The glass substrate with a conductive film for a solar cell as described in claim 1, wherein the thermal expansion coefficient of the glass substrate is from 60 to 85×10$^{-7}$/° C.

4. The glass substrate with a conductive film for a solar cell as described, in claim 1, wherein the warp deformation amount W of the glass substrate after a heat treatment at 500° C. for 30 minutes is 0.5 μm/cm$^2$ or less.

5. The glass substrate with a conductive film for a solar cell as described in claim 1, wherein the warp deformation amount W of the glass substrate after a heat treatment at 550° C. for 30 minutes is 0.5 μm/cm$^2$ or less.

6. The glass substrate with a conductive film for a solar cell as described in claim 1, wherein the strain point of the glass substrate is 525° C. or more.

7. The glass substrate with a conductive film for a solar cell as described in claim 1, wherein the solar cell is a dye-sensitized solar cell.

* * * * *